United States Patent [19]
Kahn

[11] 3,952,251
[45] Apr. 20, 1976

[54] NARROW BANDWIDTH, COMPATIBLE SINGLE SIDEBAND (CSSB) TRANSMISSION SYSTEM, AND THREE TONE GENERATOR USED THEREIN

[76] Inventor: Leonard R. Kahn, 70 N. Grove, Freeport, L.I., N.Y. 11520

[22] Filed: July 15, 1974

[21] Appl. No.: 488,708

[52] U.S. Cl................................. 325/137; 332/45
[51] Int. Cl.² ........................................... H04B 1/68
[58] Field of Search ............... 325/49, 50, 137, 138; 332/44, 45

[56] References Cited
UNITED STATES PATENTS

| | | | |
|---|---|---|---|
| 3,212,008 | 10/1965 | Kahn................................. | 325/137 |
| 3,277,376 | 10/1966 | Muller................................ | 325/137 |
| 3,350,645 | 10/1967 | Kahn................................. | 325/137 |

*Primary Examiner*—Robert L. Griffin
*Assistant Examiner*—Marc E. Bookbinder
*Attorney, Agent, or Firm*—Graybeal, Barnard, Uhlir & Hughes

[57] ABSTRACT

Compatible single sideband (CSSB) transmission system utilizing a three tone generator to develop the characteristic CSSB modulation of an electromagnetic energy carrier wave, i.e. a somewhat reduced level carrier, a full level single sideband, and a lower level second order sideband, with only nominal envelope distortion and within the narrow bandwidth restrictions commonly assigned to voice communication systems and the like. In one aspect, the invention accomplishes restriction of the bandwidth of the transmitted CSSB signal by conjunctively or alternatively using only the relatively low audio frequencies (frequencies below about one-half of the frequency span of the prescribed bandwidth) to modulate the CSSB generator and separately modulating a single sideband suppressed carrier (SSBSC) generator with the higher audio frequencies, then summating the respective generator outputs to provide the transmitted signal. As a result of this procedure, all audio frequencies within the allocated bandwidth are represented in the transmitted signal and the signal is nonetheless a highly acceptable CSSB type signal in that the relatively higher audio frequencies are normally relatively weak and incur relatively low envelope distortion and in that there are essentially no out-of-band spectral components in the transmitted signal.

26 Claims, 2 Drawing Figures

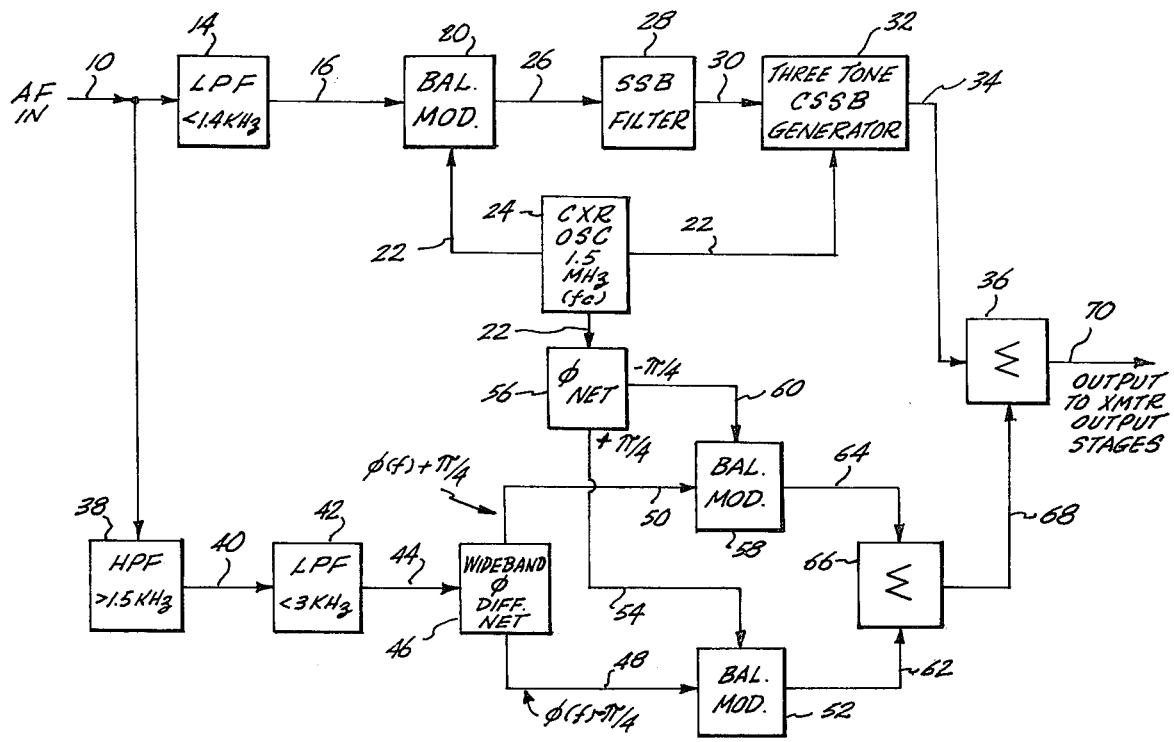
*Fig. 1.* CSSB TRANSMITTER EXCITER
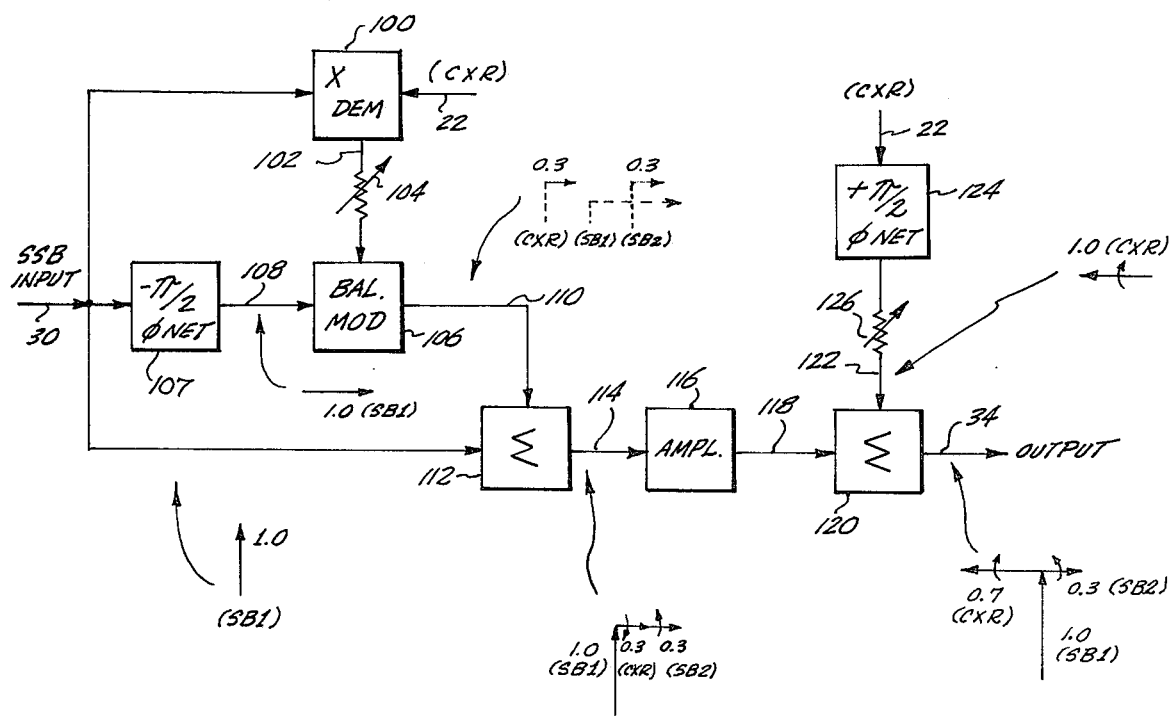
*Fig. 2.* THREE TONE CSSB GENERATOR (32)

NARROW BANDWIDTH, COMPATIBLE SINGLE SIDEBAND (CSSB) TRANSMISSION SYSTEM, AND THREE TONE GENERATOR USED THEREIN

BACKGROUND OF THE INVENTION

1. Field of the Invention

This invention relates to compatible single sideband (CSSB) transmission techniques, particularly with regard to the development of a CSSB signal within relatively narrow bandwidth restrictions, i.e. with precise spectral characteristics, and with low envelope distortion. In preferred form, such a system utilizes a three tone CSSB generator modulated with audio frequencies less than about one-half of the highest audio frequency signal acceptable within the bandwidth and modulates a SSBSC generator with the higher audio frequencies acceptable within the bandwidth, the generator outputs being summated to provide the transmitted signal.

2. Description of the Prior Art

Previous techniques for developing what is known as compatible single sideband modulation of an electromagnetic carrier wave are described in my prior U.S. Pat. Nos. 2,989,707; 3,012,209; 3,212,008; and 3,350,645. Also of interest are discussions of this general type of system as such appear in the National Association of Broadcasters Engineering Handbook, 1960, published by McGraw-hill & Company, at pages 8–41 through 8–52, and my article in Proceedings IRE, issue of October 1961, at pages 1503 through 1527. As referred to in said U.S. Pat. No. 2,989,707 at column 9, lines 40–47, and in said U.S. Pat. No. 3,212,008, at column 3, line 15, for example, a CSSB modulated carrier wave characteristically is a three tone wave at 100 percent modulation with a carrier level of about 0.7 (i.e. at a reduced level), a first order sideband level of about 1.0 (i.e. at full level), and a second order sideband level of about 0.3 (i.e. at a lower level). Further details as to the nature of my prior CSSB techniques may be had by making reference to the foregoing patents and articles and to the extent such are pertinent to the present invention the disclosure of said patents and articles are incorporated herein by this reference.

Of particular interest of the technique here presented involving CSSB modulation of the lower frequencies of the audio signal and SSB modulation for higher frequency components is early work in Great Britain and the Netherlands reported in an article by P. P. Eckersley, entitled "Asymmetric-Sideband Broadcasting", appearing in the September 1938 issue of Proc. IRE (Vol. 26), at pages 1041–1092, and in an article by N. Kroomans entitled "Asymmetric-Sideband Broadcasting" appearing in the November 1939 issue of Proc. IRE. (Vol. 27), at pages 687–690. These articles report an asymmetric sideband broadcasting utilizing double-sideband transmission for low audio frequency components and single-sideband transmission for higher frequency components. These workers in the field recognized the fact that the high frequency components were generally low in amplitude and therefore distortion of full carrier single sideband transmission would not be as excessive; however, use of double sideband modulation for even the lower frequencies involves considerably more spectrum space than is required for a pure single sideband system or for the modulation system presented by this invention, in that the low frequencies in the double sideband modulation system require spectrum space in what might be termed the undesired sideband.

Also of general interest with regard to the subject compatible single sideband transmission systems are the following:

| | | |
|---|---|---|
| Olive | U.S. | 2,900,459 |
| Olive | | 2,944,228 |
| Logan Jr. et al | | 3,085,203 |
| Kessel et al | | 3,274,492 |
| Muller | | 3,277,376 |
| Kessel | | 3,295,072 |
| Remely | | 3,323,064 |
| Kessel et al | | 3,378,772 |
| Kessel | | 3,409,832 |
| Kessel | | 3,449,715 |

SUMMARY OF THE INVENTION

The present invention relates to an improved method for producing a compatible single-sideband wave (CSSB), i.e. a modulated radiant energy carrier wave which is compatibly receivable by either a single sideband (SSB) receiver or a conventional AM receiver utilizing envelope detection. The invention provides a relatively inexpensive means for generating such a wave and provides a wave which has a relatively small amount of envelope distortion and a relatively narrow bandwidth as compared with certain other CSSB transmission systems.

The main application of the invention is in the field of communication systems although it also has applications to use in broadcasting systems where a small amount of envelope distortion is acceptable.

A number of methods have been developed for producing an SSB wave which may be received by envelope detector means. Most of these methods are theoretically free of envelope distortion and are designed for broadcasting systems. In broadcasing, even small amounts of envelope distortion may create difficulty and therefore, the envelope distortion characteristic is of great concern.

In communications systems such as used in ship-to-shore and ground-to-air operations a small amount of envelope distortion is of less consequence than in broadcasting, but such communications systems are expressly limited to a relatively narrower signal bandwidth than are broadcastng systems.

In the present invention, some degree of distortion is accepted in order to achieve better spectrum economy, i.e. a narrower bandwidth. Thus, one of the advantages of this new system is that it generates a three component wave comprising a carrier and a first and second order sideband with all other spectrum components greatly attenuated. The circuitry required for the generation of this wave is quite simple and inexpensive and relatively easy to adjust and operate Another feature of a preferred form of this invention is that in such form a three spectral component wave is used for low frequency signals below approximately one-half of the highest signal frequency component ($f_h$) and a conventional SSB full carrier wave (A3H) is used for frequencies above a frequency of one-half of the highest frequency signal component. Such a system is based upon the fact that voice and most musical waves have only relatively weak components above 1500 Hz and because a conventional full carrier SSB signal (A3H) has relatively low envelope distortion for weak sidebands, rendering the overall envelope distortion of such a two path signal quite tolerable.

In other words, a three-tone (i.e. CSSB) wave is used at low modulating frequencies where strong signal components are common and a twa-tone (i.e. SSB) wave is used for higher frequency modulating components. The second order sideband component is displaced from the carrier by a frequency of 2 times the frequency of the audio signal. However, since the highest frequency second order sideband component is displaced from the carrier by $2 \times f_h/2$ or $f_h$ Hertz in the system of the invention, and since a conventional single-sideband system occupies a band of frequencies bounded by the carrier and the highest signal frequency ($f_h$), the spectrum economy of this new CSSB system is equal to that of a conventional single-sideband (SSB) transmission system.

In view of the foregoing it is the object of the present invention to provide a CSSB modulated carrier wave having relatively low envelope distortion and good spectral characteristics.

Another object of the invention is to provide a CSSB modulation system which is relatively inexpensive to produce and simple to adjust.

A further object is to provide a modulating system usable to transmit signals that are compatible with existing AM receivers and with receivers designed for CSSB reception using envelope detectors.

The system of the preferred embodiment utilizes means for separating the highest frequency components above approximately one-half the highest permissible signal frequency from the signal frequencies below approximately one-half the signal frequency. The selected lower frequency components are then fed to a novel CSSB generator which produces for every single tone a carrier and a first and second order sideband component with both of the sideband components being on the same frequency side of the carrier; i.e. if an upper sideband wave is selected both the first and second order components would be in the upper sideband. For the higher frequency signal components circuitry is provided for generating a conventional full carrier SSB wave (A3H); thus for each single tone transmitted a carrier and an SSB wave is produced with the single-sideband for each higher frequency tone being on the same side of the carrier wave as the sideband for each lower frequency tone. Means are further provided for summating the various sidebands and carrier and amplifying and frequency converting the composite wave to desired radiation transmission frequency in a manner known per se.

A second version of the system of the invention treats both high and low frequency signals components in the same three component generator; i.e., the separation means and the A3H wave generator can be omitted. This arrangement requires slightly more spectrum but is simpler and less expensive than the two path system.

BRIEF DESCRIPTION OF THE DRAWINGS

The foregoing and other objective features and characteristics of the present invention will be apparent from the following specification, description, and accompanying drawings relating to typical embodiments thereof wherein like numerals refer to like parts and wherein:

FIG. 1 is a block diagram of a typical system constructed in accordance with the teachings of the present invention; and FIG. 2 is a block diagram of a three-component compatible single-sideband (CSSB) generator which may be used to produce the entire sideband wave or may be used as the CSSB generator 32 in the system shown in FIG. 1.

DESCRIPTION OF THE PREFERRED EMBODIMENT

FIG. 1 is a block diagram of an CSSB transmitter exciter embodying the invention, and using a conventional SSB generator for the generation of the SSB full carrier (A3H) wave which is used to transmit the frequencies above the center of the audio frequency band; i.e. above 1.5 kHz in a typical voice communications system occupying a 3 kHz bandwidth.

Referring to FIG. 1, the audio frequency signal input 10 is fed to lowpass filter 14 having a cutoff frequency of approximately 1.4 kHz. Output 16 from filter 14 is fed to balanced modulator 20. Also fed to the balanced modulator 20 is a carrier signal input 22 from carrier oscillator 24 which in the example shown operates at a frequency of 1.5 MHz. The output 26 of the balanced modulator 22 is a double sideband suppressed carrier (DSBSC) signal having a sideband structure starting typically from about 300 Hz above and below the 1.5 MHz suppressed carrier and extending approximately ±1.4 kHz from the carrier. This double-sideband suppressed carrier wave output 26 then is applied to single-sideband filter 28, wherein one sideband is selected as the output 30 (the upper sideband USB being selected in the example presented). Said output 30 of the sideband filter 28 is therefore a single-sideband suppressed carrier (SSBSC) wave extending from the carrier plus the lowest audio frequency transmitted to a frequency about 1.4 kHz above the suppressed carrier frequency. This output wave 30 is then fed to a suitable CSSB generator such as the three tone CSSB generator 32 which is described below and shown in FIG. 2. The output 34 of this special generator 32 feeds a summation circuit 36.

The higher frequency audio components found in input signal 10 are processed in the following manner. Audio signal input 10 is also fed to highpass filter 38 which passes frequencies above 1.5 kHz. The output 40 from filter 38 is in turn applied to lowpass filter 42 which restricts the highest frequency component in filter output 44 to 3 kHz, in the example selected.

Said output 44 from filter 42 feeds a conventional phase shift sideband generator of a type well known per se in the art. Specifically, band phase difference network 46 produces two output waves 48, 50 displaced in phase by approximately 90° over the required audio frequency range; i.e., between 1.5 and 3 kHz in this example.

Said output 48 feeds a balanced modulator 52 which also receives an input 54 derived from carrier oscillator output 22 through phase shift network 56, i.e. input 54 is the 1.5 MHz carrier frequency displaced by $+\pi/4$ radians. The second output 50 from the wideband phase difference network 46 similarly feeds balanced modulator 58 which also receives an input 60 from phase shift network 56, the input 60 being the 1.5 MHz carrier frequency displaced by $-\pi/4$ radians.

The outputs 62, 64 of the two balanced modulators 52, 58 are combined in summation circuit 66 which in turn provides an input to summation circuit 36. This output 68 from the summation circuit 66 is a conventional SSB suppressed carrier wave and, when it is added in circuit 36 to the carrier wave in output 34 from the three tone CSSB generator 32, there is produced in output 70 a conventional full carrier SSB wave, i.e. a type of wave designated A3H according to FCC classification.

It is to be noted that the carrier produced by the CSSB generator 32 beomes the carrier for the higher audio frequency modulated SSB output 68 summation of the two modulated waves in summation circuit 36.

As is known, an A3H wave is relatively free of envelope distortion at low percentage of modulation. However, if an A3H type wave is used for low audio frequencies where relatively high amplitude components are transmitted, the envelope distortion can be as much as about 24 percent. To forestall this distortion the system shown in FIG. 1 utilizes a three tone CSSB wave for the low frequency audio components, where it is normally necessary to accommodate high amplitude signals and uses a conventional two tone type signal for higher frequency components where relatively weak signals are normally transmitted. Thus the output 70 of the summation circuit 36 provides the desired modulated wave according to the present invention. The output 70 is applied to the power output stage or stages (not shown) of a transmitter in a manner known per se.

Instead of the phase shift type sideband generator 46–66 shown in FIG. 1 a filter type sideband suppressed carrier generator can be used or for that matter any other type of SSB generator can be used. If a filter type generator is used, the lowpass filter, 42 can be omitted because the sideband generator also conveniently provides selective attenuation of frequencies above 3 kHz above the carrier.

FIG. 2 is a block diagram showing of the three tone CSSB generator 32 in FIG. 1. As earlier indicated this circuit generates from a single-sideband suppressed carrier input 30 a three tone CSSB wave output 34 which, while having a small amount of envelope distortion, has a strictly confined spectrum composition. As will be apparent, generator 32 can be used as a part of an overall system for restricting bandwidth as shown in FIG. 1, or it can be used as a CSSB generator by itself and handle the entire audio frequency signal in any application where CSSB type signal generation is desired. In the latter case an occasional high amplitude high frequency voice component can create some slight degree of additional interference but for most voice waves this is a rare occurrence. Use of the overall system as shown in FIG. 1 would guard against such an occasional problem, but the relative simplicity of FIG. 2, when used as an overall system, would be appealing for many applications.

In FIG. 2, as indicated, the input 30 is a conventional SSB suppressed carrier wave and in the example selected is an upper sideband wave. This SSB suppressed carrier wave input 30 is applied, as shown, to product demodulator 100 which is also fed a sample 22 of the carrier frequency (CXR) (again, in this example, a 1.5 MHz wave). The output 102 of the product demodulator 100 is an audio frequency wave having the same spectral composition as the audio signal wave (i.e. as output 16 in FIG. 1). However, due to the characteristic of sideband filter 28 and other circuitry in the balanced modulator 20 and filter 28, the phase characteristics of the signal output 102 are generally quite different from the input signal 30. Since the human ear is insensitive to phase changes in voice signal this creates no problem. However, for proper production of the three tone wave output 34 it is important that proper phase relationships are maintained in FIG. 2 circuit. Thus, product demodulation is provided by demodulator 100 to reconstruct the audio frequency signal at its output 102. A similar situation is found in the system disclosed in my aforesaid U.S. Pat. No. 3,212,008.

The audio output 102 from the product demodulator 100 is fed through audio gain control 104 to balanced modulator 106. Also fed to the balanced modulator 106 is a sample 108 of the SSB suppressed carrier input 30 after it is passed through 90° phase shift network 107.

In the case of a single tone input 102 balanced modulator 106 produces an output 110 characteristically involving a two tone wave symmetrically surrounding the SSB suppressed carrier component and displaced from that component by plus or minus the frequency of the input modulating tone 102. Since the SSB component appearing at input 30 is displaced from the carrier $f_c$ by the same frequency, one of the components at the output 110 of the balanced modulator 106 falls at exactly the frequency of the carrier. The second component produced in balanced modulator 106 falls at 2 times the frequency of the input tone plus the carrier frequency. This output wave 106 is then applied to summation circuit 112 where it is linearly added to the SSB suppressed carrier wave input 30. The output 114 from summation circuit 112 is fed to amplifier 116 which in turn feeds its output 118 to summation circuit 120. The other input 122 is summation circuit 120 is the carrier wave input 22 which has been rotated by 90° in phase shift network 124 adjusted in amplitude by level adjust circuit 126. The output 34 of summation circuit 120 is the desired three tone wave wherein, the carrier at full modulation has a relative amplitude of about 0.7 (i.e at a reduced level), the first order sideband has a relative amplitude of about 1.0 (i.e. at a full level), and the second order sideband has a relative amplitude of about 0.3 (i.e. at a lower level), all substantially equating with the theoretical values derived in the aforesaid paper entitled Compatible Single-Sideband, appearing in the October 1961 issue of the Proceedings of the Institute of Radio Engineers. The characteristics of such a three component wave was discussed in detail in that paper in Section 4 on page 1507. It is noted there that the envelope distortion of such a wave would be in the order of 5 percent. Such envelope distortion is entirely adequate for most communications applications. Furthermore, as the percentage of modulation decreases the envelope distortion also decreases.

Another criterion for the three tone CSSB wave is that the second order component fall off as a squared function of modulation. This can be seen by studying equation 1 on page 1508 of the above referenced article. The fact that the system shown in FIG. 2 does indeed follow the indicated squared characteristic can be seen by recognizing that the second order sideband is produced from the first order sideband in product demodulator 100 and modulation of the first order sideband. Since this is, in effect, a multiplication process and both factors are linear functions of modulation the resultant is a squared function. Therefore, the output second order component has the proper characteristics.

Also, it should be noted that the carrier level varies between 1.0 and 0.7. At 0percent of modulation the component at the carrier frequency but out of phase with it has an amplitude of zero so it does not reduce the net carrier voltage from unity. However, at 100 percent modulation the out of phase component has a relative amplitude of 0.3 and the difference therefore is 0.7. The first order sideband level is a linear function of the modulation level and between 0 percent and 100 percent modulation the amplitude of the second order sideband (SB2) and the level used in reducing the carrier (CXR) is directly proportional to the square of the first order sideband (SBI) level. This may be seen by recognizing the fact that the audio output 102 from the product demodulator 100 is a linear function of the level of the audio input 10 fed to the system. The output 102 of the balanced modulator 100 is therefore a squared function of the audio input 10 as both inputs to the balanced modulator 106 are linear functions of the audio input 10. Thus, the three tone wave satisfies equation 1 of the aforesaid October, 1961 publication which is copied below:

$$e = E_{carrier}[(1 - 0.3m^2) \cos w_c t + m \cos(w_c + w_{AI}) + 0.3m^2 \cos (w_c + 2w_{AI})t], \quad (1)$$

where
$E_{carrier}$=carrier voltage when modulation is absent,
$m$=envelope modulation factor,
$w_c$=angular velocity of carrier,
$w_{AI}$=angular velocity of tone modulation.

From the foregoing, various modifications, revisions and adaptations of the CSSB signal generation and modulation systems and of the invention will occur to those skilled in the art to which the invention is addressed, within the scope of the following claims.

What is claimed is:

1. The method of developing a CSSB modulated carrier wave characterized at full modulation by a reduced level carrier, a full level first order single sideband and a lower level second order sideband, comprising:
   a. generating an audio signal input,
   b. generating a full level carrier wave,
   c. modulating at least a lower frequency portion of said audio signal input on the carrier wave and isolating a single sideband and carrier components of the modulated signal to derive a full level single sideband suppressed carrier (SSBSC) wave,
   d. generating from a sample of such SSBSC wave and said carrier wave a wave comprised of a lower level carrier and a lower level second order sideband and summating such waves with a full level sample of said SSBSC wave to produce a sum wave, and
   e. summating a phase shifted sample of the said full level carrier wave with said sum wave to provide said CSSB modulated carrier wave output.

2. The method of claim 1, comprising generating the CSSB modulated carrier wave by modulating the carrier frequency only with audio input frequencies less than about one-half of the maximum audio frequency within said audio signal input.

3. The method of claim 2, wherein the maximum audio frequency within said audio signal is about 3kHz and the audio input frequencies modulating the carrier wave to provide the CSSB modulated carrier wave are comprised of frequencies less than about 1.4 kHz.

4. The method of claim 1, wherein the CSSB modulated carrier wave at full modulation is characterized by relative levels of the carrier, first order single sideband and second order sideband substantially in the ratio 0.7:1.0:0.3, respectively.

5. The method of claim 3, wherein the CSSB modulated carrier wave at full modulation is characterized by relative levels of the carrier, first order single sideband and second order sideband substantially in the ratio 0.7:1.0:0.3, respectively.

6. The method of claim 1, wherein the full level carrier wave of step (e) and the carrier of the sum wave generated in step (d) are of opposite phase.

7. The method of claim 1, wherein the amplitude of the second order sideband and the extent of reduction of the carrier level with respect to the level of the first order sideband are substantially directly proportional to the square of the first order sideband level for all modulation levels.

8. In a single sideband transmission system the method of generating a CSSB type modulated wave characterized at full modulation by a reduced level carrier, a full level first order sideband and a lower level second order sideband within a given bandwidth and with only nominal envelope distortion, comprising:
   a. generating an audio signal input,
   b. selecting a lower frequency portion of the audio signal input including only frequencies thereof less than about one-half the highest audio frequency within said audio signal input,
   c. generating a full level carrier frequency and modulating said carrier frequency with said lower frequency portion of the audio signal input and deriving therefrom a full level single sideband suppressed carrier (SSBSC) wave,
   d. generating from such SSBSC wave and said carrier wave, a compatible single sideband (CSSB) wave,
   e. selecting a higher frequency portion of the audio signal input including only frequencies thereof greater than about one-half the highest audio frequency within said audio signal input,
   f. modulating a phase shifted carrier frequency with said higher frequency portion at the audio signal input and deriving therefrom a single sideband suppressed carrier (SSBSC) wave, and
   g. summating the said CSSB modulated carrier and SSBSC waves.

9. The method of claim 8, wherein the bandwidth of the audio signal input is about 3 kHz and said lower frequency portion is comprised of frequencies less than about 1.4 kHz.

10. The method of claim 8, wherein the relative levels of the carrier, first order single sideband and second order sideband are substantially in the ratio 0.7:1.0:0.3, respectively.

11. The method of claim 10, wherein the amplitude of the second order sideband and the extent of reduction of the carrier level with respect to the level of the first order sideband are substantially directly proportional to the square of the first order sideband level for all modulation levels.

12. The method of claim 8, wherein the CSSB modulated carrier wave is generated by:
   d1. balance modulating a sample of such SSBSC wave by an audio frequency wave derived from said SSBSC wave and the carrier wave to obtain a wave comprised of a lower level carrier wave and a lower level second order sideband,
   d2. summating such lower level waves with a full level sample of said SSBSC wave, and d3. phase shifting a further sample of the carrier wave and combining such with the wave generated in step (d2) to provide the CSSB modulated carrier wave output.

13. A three-tone compatible single-sideband generator comprising:
   a. balanced modulator means producing from a full level carrier wave and a full level single sideband suppressed carrier (SSBSC) wave a wave with a lower level carrier and a lower level second order sideband,
   b. first summation means combining the wave produced by the modulator means with said SSBSC wave,
   c. means providing a full level carrier wave of opposite phase to the phase of said lower level carrier, and
   d. second summation means combining such oppositely phased full level carrier wave with the output of said first summation means thereby providing a three tone compatible single sideband signal.

14. Means developing a CSSB modulated carrier wave characterized by the presence at full modulation of a reduced level carrier, a full level first order single sideband and a lower level second order sideband, said modulator means comprising:
   a. means generating an audio signal input,
   b. means generating a full level carrier wave,
   c. means modulating at least a lower frequency portion of said audio signal input on the carrier wave to form a full level single sideband suppressed carrier (SSBSC) wave,
   d. means generating from such SSBSC wave and said carrier wave a wave comprised of a lower level carrier wave and a lower level second order sideband,
   e. means summating the wave generated by means (d) with a full level sample of the SSBSC wave to form a sum wave, and
   f. means phase shifting a sample of the full level carrier wave and combining such phase shifted carrier with said sum wave to provide said CSSB modulated carrier wave output.

15. The means of claim 14, wherein the means forming the SSBSC carrier wave comprises means selecting only audio input frequencies less than about one-half of the maximum audio frequency within the audio signal input.

16. The means of claim 15, wherein said audio signal input has a bandwidth of about 3 kHz and the audio input frequencies modulating the carrier wave comprise only frequencies less than about 1.4 kHz.

17. The means of claim 14, wherein the CSSB modulated carrier wave at full modulation is characterized by relative levels of the carrier, first order single sideband and second order sideband substantially in the ratio 0.7:1.0:0.3, respectively.

18. The means of claim 16, wherein the CSSB modulated carrier wave at full modulation is characterized by relative levels of the carrier, first order single sideband and second order sideband substantially in the ratio 0.7:1.0:0.3, respectively.

19. The means of claim 14, wherein said lower level carrier and said phase shifted carrier wave sample are in opposite phase.

20. The means of claim 14, wherein the amplitude of the second order sideband and the extent of reduction of the carrier level with respect to the level of the first order sideband are substantially directly proportional to the square of the first order sideband level for all modulation levels.

21. In a compatible single-sideband (CSSB) transmitter:
   a. means for providing an audio frequency input,
   b. means for providing a full level carrier wave,
   c. means for separating a lower frequency portion from said providing means and means generating a CSSB wave from said lower frequency portion and said carrier wave,
   d. means for separating a higher frequency portion from said audio input and means generating a single sideband suppressed carrier SSBSC wave from said higher frequency portion and said carrier wave, and
   e. means for summating the CSSB wave and the SSBSC wave to provide a sum signal for transmission.

22. A single sideband transmission system wherein a CSSB type modulated wave characterized at full modulation by a reduced level carrier, a full level first order single sideband and a lower level second order sideband is generated within a given bandwidth and with only nominal envelope distortion, said system comprising:
   a. means generating an audio frequency input,
   b. means selecting a lower frequency portion of the audio frequency input including only frequencies thereof less than about one-half of the maximum audio frequency of the audio frequency input,
   c. means generating a full level carrier wave,
   d. means providing a CSSB modulated carrier wave from said carrier wave and said lower frequency portion of the audio frequency input,
   e. means selecting an upper frequency portion of the audio frequency input including only frequencies thereof greater than one-half of the maximum audio frequency of the audio frequency input,
   f. means providing a phase shifted carrier wave,
   g. means modulating said phase shifted carrier wave with such high frequency portion of the audio frequency input to provide an SSBSC wave, and
   h. summation means combining the CSSB and SSBSC waves.

23. The system of claim 22, wherein the highest frequency of the audio frequency input is about 3kHz and the lower frequency portion thereof modulating the carrier comprises frequencies less than about 1.4 kHz.

24. The system of claim 22, wherein the CSSB modulated carrier wave at full modulation is characterized by relative levels of the carrier, first order single sideband and second order sideband substantially in the ratio 0.7:1.0:0.3, respectively.

25. The system of claim 24, wherein the amplitude of the second order sideband and the extent of reduction of the carrier level with respect to the level of the first order sideband are substantially directly proportional to the square of the first order sideband level for all modulating levels.

26. The system of claim 22, wherein the means providing the CSSB modulated carrier wave includes:
   d1. means modulating the lower frequency portion of the audio signal input on the carrier wave and isolating a single sideband thereof by suppressing the other sideband and carrier components of the modulated signal to form a full level single sideband suppressed carrier (SSBSC) wave, d2. balanced modulator means developing from a sample of said SSBSC wave and said carrier wave an output wave with a lower level carrier and a lower level second order sideband,
d3. means summating such output wave with a full level sample of said SSBSC wave to provide a sum wave, and
d4. means phase shifting a further sample of said carrier wave and combining such with said sum wave to provide the CSSB modulated carrier wave output.

* * * * *